United States Patent [19]

Sachdev et al.

[11] Patent Number: 4,894,279
[45] Date of Patent: * Jan. 16, 1990

[54] ELECTROEROSION PRINT MEDIA HAVING PROTECTIVE COATINGS MODIFIED WITH ORGANOTITANIUM REAGENTS

[75] Inventors: Krishna G. Sachdev, Wappingers Falls; Keith S. Pennington, Somers; Mitchell S. Cohen, Ossining, all of N.Y.

[73] Assignee: International Business Machines Corporation, Amonk, N.Y.

[*] Notice: The portion of the term of this patent subsequent to Jun. 9, 2004 has been disclaimed.

[21] Appl. No.: 861,393

[22] Filed: May 9, 1986

[51] Int. Cl.$^4$ ............... B41C 1/10; B41M 5/24; G01D 15/06
[52] U.S. Cl. ............... 428/216; 101/462; 346/135.1; 346/163; 428/217; 428/336; 428/412; 428/416; 428/423.7; 428/424.8; 428/425.1; 428/425.8; 428/464; 428/470; 428/481; 428/536
[58] Field of Search ............... 428/412, 416, 461, 480, 428/483, 470, 216, 217, 336, 423.7, 424.8, 425.1, 425.8, 464, 481, 536; 346/135.1, 163

[56] References Cited

U.S. PATENT DOCUMENTS 2,983,221  5/1961  Dalton et al.
4,617,579 10/1986  Sachdev et al. ............... 346/135.1

FOREIGN PATENT DOCUMENTS 0113005  7/1984  European Pat. Off.
0113007  7/1984  European Pat. Off.

Primary Examiner—James C. Cannon
Attorney, Agent, or Firm—Sughrue, Mion, Zinn, Macpeak & Seas

[57] ABSTRACT

The present invention provides an improved electroerosin recording medium which comprises, in a preferred embodiment, a non-conductive support, a hard, abrasion resistant layer, preferably comprising an organic polymer matrix containing an inorganic particulate material, a thin conductive film, typically of a metal such as aluminum, and an abrasion resistant overlayer that most preferably comprises a solid conductive lubricant dispersed in an organotitanium regaent modified polymer system. The overlayer is highly adherent to the conductive surface, has a low organic binder content and provides effective protection against abrasion of the conductive layer and fouling of a print head during electroerosion printing.

13 Claims, 1 Drawing Sheet

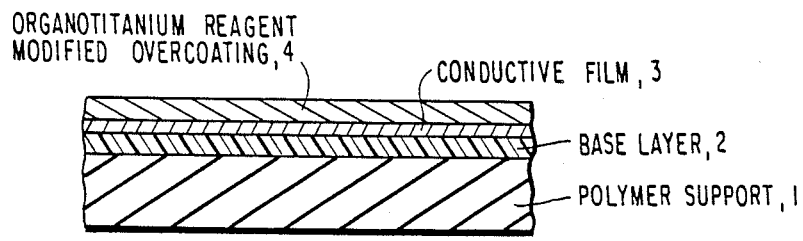
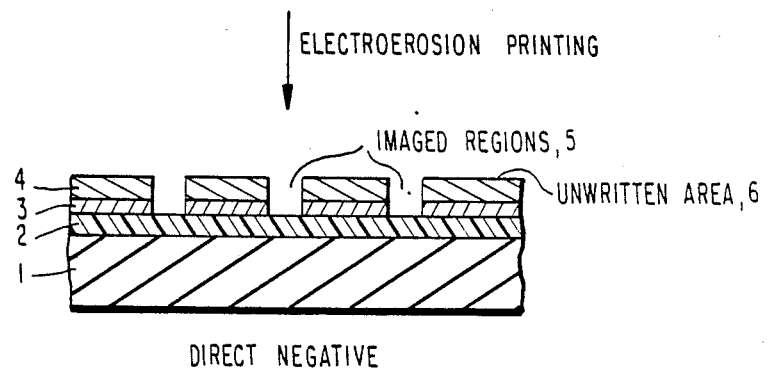
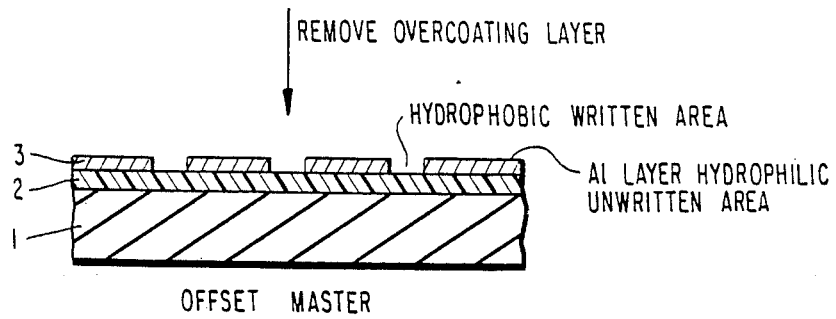

ELECTROEROSION PRINT MEDIA HAVING PROTECTIVE COATINGS MODIFIED WITH ORGANOTITANIUM REAGENTS

BACKGROUND OF THE INVENTION

1. Field of the Invention

The present invention relates to improvements in protective coatings for electroerosion print media.

2. Description of the Prior Art

Electroerosion printing is a well known technique for producing markings such as letters, numbers, symbols, patterns, such as circuit patterns, or other legible or coated indicia, on a recording material. This is typically performed by computer-output controlled printing which involves removal of an aluminum layer from selected areas of the recording material as the result of spark initiation.

The surface which is locally eroded or removed during writing to provide such indicia on the recording material is a thin film of conductive material, usually a vacuum deposited aluminum layer, which vaporizes in response to the high localized temperature associated with sparking (arcing) initiated by applying an electric current to a stylus, more generally to multiple styli, typically tungsten wire in a printing head, having electrical contact between the surface of the thin conductive film and the tip of the stylus.

Electroerosion printing is effected when the stylus, styli or print head sweep across the surface of the recording medium. Electrical writing signals are fed to the stylus, styli or print head to provide controlled electrical pulses which generate sparks accompanied by high local temperatures at the surface of the recording material causing a selective disruption and evaporation of the aluminum film in areas of the recording material. The locations from which material has been removed correspond to the indicia or images which are to be recorded.

Electroerosion recording materials and printing processes are useful to directly produce human readable images, photomasks, etc. Special paper and polymer substrates have been employed which are coated with a black organic underlayer and then the electroerodable conductive layer, typically a metal film such as vapor deposited aluminum film, is deposited. For details on such materials heretofore used in electroerosion printing, see U.S. Pat. No. 4,082,902, A. Suzuki et al, U.S. Pat. No. 3,786,518, B. Atherton, and U.S. Pat. No. 4,086,853, M. Figov et al.

The use of electroerosion techniques for high resolution output that can be employed as a "direct negative" as well as a "direct master" or a camera-ready copy for offset lithographic printing requires fabrication of special recording media for problem-free and scratch-free printing. When the usual transparent polyester substrate with a vacuum deposited thin aluminum film is employed as a recording medium for high resolution electroerosion printing, severe mechanical scratching of the aluminum layer is observed which may be due to plastic deformation of the substrate during printing and/or due to slight differences in the pressue on individual styli in a multi-styli head. The aluminum film apparently cannot withstand the high strains generated when the support or substrate is deformed and therefore suffers mechanical failure resulting in scratching. Also, there are occasions when the styli cold-weld to the thin aluminum conductive layer so that the structure suffers shear either at the aluminum-substrate interface or below it in the substrate itself.

It has been recognized for some time, therefore, that the use of a lubricant and/or protective overcoat on the surface of an electroerosion recording material would be helpful to reduce this problem of scratching.

The prior art has utilized lubricants comprising long chain fatty acids. However, even with the use of such lubricants, some electrode scratching of the removable layer of the electroerosion recording material still remains. Accordingly, efforts continue to be directed to finding a superior lubricant and/or protective layer composition for the surface of electroerosion recording materials.

U.S. Application Ser. No. 454,743, Cohen et al, filed Dec. 30, 1982 and now abandoned describes electroerosion recording media suitable for high resolution printing to produce high quality "direct negatives" and short run "offset masters".

Several additional prior art patents relevant to electroerosion recording or printing are discussed below.

U.S. Pat. No. 2,983,220, Dalton et al, discloses a lithographic coating on an electroerosion recording sheet. The coating may be a copolymer binder system containing zinc oxide and zinc sulfide.

A layer containing a conductive material, such as graphite, is disclosed in U.S. Pat. No. 3,048,515, Dalton et al.

An electroresponsive recording blank having a removable masking layer containing a luminescent material is disclosed in U.S. Pat. No. 2,554,017, Dalton et al.

Other prior art providing further general background in the field of electroerosion printing includes U.S. Pat. No. 3,138,547, Clark, and U.S. Pat. No. 3,411,948, Reis.

High temperature lubricants comprising graphite in oil are also known as disclosed in U.S. Pat. No. 3,242,075, Hunter.

U.S. Pat. No. 3,514,325, Davis et al, discloses an electroerosion recording material in which a surface layer of crosslinked binder containing conductive particles such as zinc oxide is placed on top of a thin aluminum layer.

U.S. Pat. No. 4,305,082, Kusakawa et al, describes an electroerosion recording paper in which a resistance layer may be provided over a thin conductive aluminum film.

U.S. Pat. No. 4,304,806, Anderson et al, describes information-carrying disks coated with an abrasion resistant polymer layer derived from an epoxy-terminated silane.

U.S. Pat. No. 3,002,854, Bril et al, relates to a process involving treatment of a solid surface with titanium organic compositions to improve adhesion with other surfaces.

U.S. Pat. No. 3,082,117, Schilly, relates to coated films, particularly to organic based films such as polyethylene terephthalate, having a continuous coating of a heat-sealable thermoplastic organic polymeric coating which involves applying a continuous coating of a solution of a titanium organic compound from the group consisting of hydrolyzable organic titanium esters and reaction products of acetylacetone with an alkyl titanate.

U.S. Pat. No. 3,951,882, A. H. Markhart et al, relates to dielectric coating compositions containing an organophilic clay pigment prepared by treatment of clay with an organotitanium compound.

SUMMARY OF THE INVENTION

One object of the present invention is to provide an electroerosion recording material having a multilayer structure with an abrasion resistant overcoating.

Another object of the present invention is to provide electroerosion recording materials having a multilayer structure with an abrasion resistant overcoating comprising one or more solid lubricants in a polymeric matrix modified by the addition of one or more organotitanium reagents.

Still another object of the present invention is to provide compositions for such abrasion resistant overcoatings in the fabrication of electroerosion recording materials which provide coatings of improved wear resistance and which have improved shelf-like.

Yet a further object of the present invention is to provide improved electroerosion recording materials having a thin, uniform overcoating which is continuous and highly adherent to a metal surface, and which does not flake off during storage and handling.

A further object of the present invention is to provide electroerosion recording materials of improved resistance to stylus scratching by use of an abrasion resistant overcoating which is fast drying, has high mechanical strength, even at a low organic binder content, and which prevents stylus fouling during the electroerosion printing process.

A further object of the present invention is to provide abrasion resistant overcoatings which also exhibit improved contrast when used to produce direct negatives by electroerosion printing. In such usage, a polymer film, e.g., a dark graphite/polymer film, modified (crosslinked) with an organotitanium reagent, can serve to block light that otherwise may be partially transmitted through the thin conductive film, e.g., a thin aluminum film.

Another object of the present invention is to provide, in a preferred embodiment, a continuous, crosslinked and conductive or resistive protective abrasion resistant overcoating for electroerosion recording media which has a low concentration of organic polymer vehicle for dispersing a solid particulate lubricant. The low binder content allows application of a relatively thicker layer over a conductive metal surface, e.g., aluminum, without adversely affecting print quality.

Another object of the present invention is to provide an electroerosion recording material as above described which further comprises a thin hard base layer of an organic polymer which is preferably crosslinked and preferably contains a particular material.

The above objects of the present invention are achieved by the use of very small proportions of an organotitanium reagent which provides a crosslinked overcoating of excellent properties which does not require the use of substantial amounts of crosslinking agent as are required in the prior art and which can be cured in situ.

BRIEF DESCRIPTION OF THE DRAWINGS

FIG. 1 of the drawings is a cross-sectional view of an electroerosion recording material in accordance with a preferred embodiment of this invention;

FIG. 2 is a cross-sectional view of a direct negative made in accordance with this invention; and FIG. 3 is a cross-sectional view of an offset master made in accordance with this invention.

In FIG. 1 of the drawings, 1 indicates the support, e.g., a polyester.

The optional hard base layer of the present invention formed thereon is represented by numeral 2 and is shown between the support 1 and the conductive film 3.

The abrasion resistant overcoating of the present invention 4 is shown deposited thereon.

In FIG. 2, a direct negative is shown formed after electroerosion printing wherein imaged regions 5 are shown where the conductive layer 3 and the abrasion resistant overcoating 4 have been removed following electroerosion printing. Also shown are unwritten areas 6. If desired, the abrasion resistance overcoating may be totally removed, but this is not necessary for direct negative use.

FIG. 3 shows a direct offset master formed per the present invention where unwritten areas 6 as shown in FIG. 2 have been removed in a conventional manner, for example, by immersion in a solvent such as isopropanol, N-butanol, FPC (from Graphic Arts Co.), etc. Typically, immersion is at room temperature and the abrasion resistant top coat is merely removed by swabbing the same.

The drawings are not to scale.

DESCRIPTION OF PREFERRED EMBODIMENTS

The electroerosion print material of the present invention comprises a support with a conductive layer thereon and an abrasion resistant overcoating or overlayer which has been formed by in situ crosslinking a polymer binder with an organotitanium reagent.

In the present application the terms "overcoating", "overlayer" or "protective layer" are used interchangeably to describe the topmost layer of the electroerosion print material of the present invention.

As the following discussion will make clear, there are several preferred and most preferred aspects of the present invention.

In a highly preferred form of the present invention the electroerosion print material comprises a support with a hard, abrasion resistant polymer-inorganic particulate film matrix thereon which is crosslinked, a thin conductive electroerodable film such as aluminum thereon and an abrasion resistant overcoating or protective overlayer comprising one or more conductive or resistive particular solid lubricants (lubricants) in a hydroxyl group-containing binder modified through incorporation of one or more organotitanium reagents. This most highly preferred form of the present invention provides superior image resolution to other forms of the present invention.

The support is the same as typically used in the prior art, e.g., paper, polymers such as polyethylene terephthalate, Riston, Kapton, polycarbonates, polypropylenes, polyethylenes, polyesters and the like.

The thickness of the support is not limited in any fashion so long as sufficient strength is provided for the end use contemplated. Typically, thicknesses will be on the order of about 1 mil to 5 mils.

The support may be opaque or light transparent or transmissive.

Where the support is a light transparent or transmissive material, the resulting product can be used as a photomask or direct negative medium for the development of photosensitive materials, e.g., in the production of offset lithography masters, circuit boards etc. Where the electroerosion electrodes have been energized and the overlayer and conductive film burned off, light windows are provided through the transparent backing so that the material is rendered selectively light transmissive and may then be used in direct-photonegative or like applications.

The major characteristic which the thin conductive electroerodable film (hereafter often merely a conductive film for brevity) must exhibit is that upon application of an electrical pulse from an electrode or stylus during electroerosion printing, the same is lifted off or eroded from the base layer along with the protective abrasion-resistant overcoat. If this criterion is met, any conductive material can be used in the present invention so long as image discrimination is provided for those uses where such is necessary.

The conductive film, typically aluminum, is usually deposited by the conventional techniques of sputtering or vacuum evaporation on the base layer. While not limitative, it preferably is about 200-1,000 Angstroms thick and has a resistivity of about 0.5 to about 5 ohms per square centimeter. Other conductive films such as magnesium are also useful per the present invention.

The optional, thin, hard polymeric base layer may or may not be crosslinked. It should have a sufficiently high tensile strength and a sufficiently high softening temperature so that it reduces plastic deformation of the support during electroerosion so that scratching of the conductive film is minimized. With hard supports, e.g., polycarbonates, benefits from the use of a base layer are reduced. However, in general, the base layer provides superior results when it is present. Preferably, the base layer contains an inorganic filler. Crosslinking the base layer is preferred since this generally provides a harder base layer, reducing the chance of generating a soft residue during electroerosion which might adhere to the electroerosion styli and inhibit writing. When a filler is used, e.g., to scour off debris, crosslinking firmly fixes the filler in place, reducing the chance of filler dislodgement and adherence to the electroerosion styli. In addition, a crosslinked base layer improves the corrosion resistance of the conductive film due to its good passivating properties, thus increasing shelf life and performance reliability.

The most preferred thin, hard base layers are harder than polyethylene terephthalate, a currently preferred support material, exhibit a high Tg, e.g., equal to or greater than 130° C., have a hardness of 20 to 30 or more (Knoops hardness), show an elongation at break of about 4 to 7% (Tensile Instron) or more, and have a contact angle with water of equal to or greater than about 75°, i.e., they are hydrophobic.

In those instances where it is contemplated that the electroerosion print material of the present invention will be used to form a direct negative, the base layer should be white, transparent or translucent; obviously, in this case if a particulate material is present to create roughness, the same must be white, transparent or translucent.

The base layer is typically formed from solvent castable polymeric/oligomeric materials containing residual reactive sites such as free hydroxyl, epoxy, olefinic, acetylenic, α, β-unsaturated carbonyl moieties, etc., which can be crosslinked by suitable reagents using heat and/or radiation to accelerate the curing process. With these materials, crosslinking can also be accomplished by thermal or radiation-induced processes without the addition of another crosslinking agent.

Following are representative examples of various crosslinked polymer systems for application in the base layer according to this invention:

Urethane crosslinked cellulosic coatings with and without roughness causing particulate material are formed from cellulose derivatives and aromatic or aliphatic polyisocyanates in the presence of suitable dispersing agents, catalysts and wetting agents well known to those skilled in the polyurethane art. Suitable cellulose derived materials include: cellulose acetate butyrate (CAB), ethyl cellulose (EC), nitrocellulose, cellulose acetate and cellulose diacetate, etc. Alternate materials containing unsubstituted hydroxyl groups for reaction with polyisocyanates to form crosslinked polyurethanes are: polyvinyl butyral, polyvinyl formal Bakelite phenoxy resins, phenolic resins, e.g., novolaks (which have a slight color), epoxies such as Eponols and polyether glycols such as "Teracol" (from DuPont), and poly(styrylallyl alcohol). Typical polyisocyanates that react with available —OH groups of cellulosic binders or alternate systems include toluene diisocyanate, diphenylmethane diisocyanate, hexamethylene diisocyanate-based systems such as Desmodur N-75 (aliphatic prepolymer, Mobay Chemical Co.) and Mondur Resins such as CB-60 and CB-75, and Mondur HC. Melamine crosslinking agents can also be employed to obtain thermoset coatings with the above binders. Inorganic fillers such as $SiO_2$, $CaCO_3$, $TiO_2$ and calcium silicate, etc., generally of a particle size ranging from 0.5 $\mu$m to 10 $\mu$m can be incorporated by the usual techniques of grinding or milling together with, e.g., the binder, the urethane solvent such as a methyl ethyl ketone (MEK)-toluene mixture, and a suitable dispersing agent such as Multron R221-75, a saturated polyester resin from Mobay Chemical Co. Other useful solvents and proportions are the same as for overlayer formation later discussed.

The urethane forming reactions of the above described binders and urethane prepolymers can be catalyzed by conventional organometallic reagents such as stannous oleate, stannous octoate, dibutyl-tin dioctoate, dibutyl-tin dilaurate, calcium or cobalt naphthenate, also tertiary amines, etc. Further acceleration of the crosslinking reaction can be achieved by thermal treatment of the coatings.

Crosslinked polymer coatings with beneficial properties can be obtained by the use of radiation (UV) curable acrylated polyurethane oligomers of the type "UVITHANE 783" and "UVITHANE 788" available from Thiokol Chemical Div. Inorganic fillers such as silica can be dispersed by the conventional techniques prior to coating.

Highly crosslinked films can also be obtained by thermal or radiation-induced copolymerization/co-crosslinking of the above UV curable urethane oligomers with added multifunctional monomers such as pentaerythritol triacrylate (PETA) and trimethylol-propane triacrylate (TMPTA) available from Celanese Corporation.

Desired crosslinked films with or without inorganic fillers can also be formed by thermal, microwave, or UV curing of coatings cast from blends of acrylated cellulosic derivatives and UV curable urethane oligomers described above.

Usually from about 0.5 to about 1.5 weight percent catalyst based on the weight of organics provides good results.

Drying/airing is usually at about 90° to about 110° C. for about 5 to about 15 minutes in air. Greater or lesser times/temperatures can be used, if desired.

For optimal performance in terms of faster curing within 3–5 minutes at 100° C. or so base coat formulations were typically formed at NCO-OH ratio of about 0.5 to about 1, more preferably 0.7 to 0.8.

The particulate solid filler, when used, is typically used in an amount of from about 3 to about 40 weight percent, more preferably from 5 to 25 weight percent, based on the weight of organics present. Talysurf Traces of typical filld films show a peak to valley ratio on the order of 1 to 2 microns.

While not to be construed as limitative, typically the base layer has a thickness of from about 2 to about 10 mm.

According to this invention, crosslinked, preferably pigmented, films as the hard base layer can also be obtained by the use of organotitanium reagents as crosslinkers for the polymer-binder of the base layer. For example, one such system would comprise amorphous silica in cellulose derivatives such as cellulose acetate butyrate, ethyl cellulose or other binders with available hydroxyl groups for crosslinking reactions with organotitanium reagents as later described. In those instances where an organotitanium reagent is used in the base layer, proportions, processing conditions, etc., are essentially the same as for the abrasion-resistant topcoat layer which will now be discussed.

As one skilled in the art will appreciate with reference to FIG. 3, when the base layer is used it has wetting characteristics opposite (hydrophobic) the unwritten areas (hydrophilic). When the base layer is not used, i.e., the support is exposed by electroerosion, the support must have wetting characteristics opposite (hydrophobic) the unwritten areas (hydrophilic).

According to this invention, a superior electroerosion recording material is generated when the aluminized structure described above is overcoated with an abrasion resistant topcoat layer which preferably comprises a conductive lubricant such as graphite, $MoS_2$, $CaF_w$, etc., most preferably graphite, in a hydroxyl group containing polymeric matrix which has been modified/crosslinked through the use of an organotitanium reagent, such as a titanium chelate or a titanium ester, which yields abrasion-resistant topcoats of superior lubricity, better adhesion to the underlying conductive layer, excellent hardness and excellent flake off resistance.

The organotitanium reagents used per the present invention are not unduly limited so long as they can crosslink the hydroxyl group containing binder to provide an abrasion-resistant overcoat.

The preferred materials are titanium esters of the formula $Ti(OR)_4$ where R is a hydrocarbon group having from 1 to 12 carbon atoms, more preferably from 3 to 12 carbon atoms and most preferably from 3 to 6 carbon atoms, with preferred examples of R being n-propyl, i-propyl, n-butyl, t-butyl, and pentyl. In theory R can be a methyl or ethyl group, but this is not preferred since in this situation the titanium esters gel the hydroxyl group containing binder extremely rapidly and, to be useful on a practical basis, a gelling retarder is necessary.

Further, as the number of carbon atoms increases above 6 in an R group, the rate of crosslinking becomes slower and for this reason such materials are not preferred.

The R groups may be the same or different in the titanium esters, but for practical purposes (ease of manufacture) they are generally the same.

The preferred titanium chelates used per the present invention are cyclic complexes formed by the reaction of titanium alkoxides with organic ligands having two or more atoms which simultaneously serve as donor sites for titanium. Examples of preferred organic ligands include 1, 3-diketones, β-ketoesters, and β-hydroxylamines.

Titanium chelates can be represented by the following general structure:

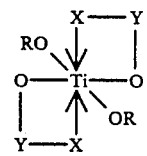

where X represents a functional group containing oxygen or nitrogen, Y represents a 2 or 3 carbon atom chain and R represents a 3 to 5 hydrocarbon chain joined with oxygen through a secondary or tertiary carbon atom. Exemplary functional groups include a carbonyl functional group (C=O) of a ketone, ester or aldehyde, or an amino functional group or a hydroxy functional group. The amines may be primary secondary or tertiary. In the above formula, the total number of carbon atoms in X and Y (which are derived from the organic ligand) when carbon atoms are present (they would not be present in the case of a primary amino group or a hydroxy group) is preferably from 2 to 12.

Typical titanium chelates are: titanium acetylacetonate, titanium triethanolamine chelate, titanium lactic acid chelate, titanium ethyl acetoacetate, octylene glycol titanate, etc.

Representative titanate esters are: tetra-n-butyltitanate, tetraethylene-glycol titanate, tetraisopropyl titanate, tetrakis(2-ethylhexyl) titanate, etc.

The organic titanium reagents including titanium esters and titanium chelates can be freely selected from those which will react with the polyhydroxy organic binders to yield a hard, non-tacky polymer film after a conventional thermal cure which causes evaporation of the casting solvent(s) and provides the desired solvent-resistant coating.

These reagents are employed to favorably modify the adhesion, solubility and mechanical characteristics of the protective overcoating to obtain thermally stable coatings. They are processable with a wide variety of hydroxyl group-containing polymers, and eliminate any problems of phase-incompatibility commonly encountered with prior art coating systems.

The organotitanium reagents are commercially available from E. I. du Pont de Nemours & Co., Inc., Pigments Department, under the trade name "TYZOR" Organic Titanates.

The organotitanium compositions for the protective coatings applicable according to this invention are most preferably formed of dispersions of a lubricant such as graphite in polymeric systems having available hydroxy groups such as cellulose derivatives such as ethyl cellulose, cellulose acetate butyrate, hydroxypropylcellulose, hydroxyethylcellulose, nitrocellulose, cellulose acetate, or materials such as polyvinyl acetal resins, polyvinyl alcohol, etc., in an alcoholic solvent such as isopropanol, to which titanium acethylacetonate or an alternate related reagent is added in an amount of about 1 to about 20% by weight of the binder, preferably 5 to 10% by weight of the binder. As earlier indicated, one substantial benefit of the use of the organotitanium reagents of the present invention is that they could be used at very low proportions as compared to conventional crosslinking agents to provide the abrasion-resistant topcoat of the present invention. They are applied by conventional deposition techniques such as dip coating, spin coating or web coating.

Subsequent drying/curing at about 50° to about 110° C. for about 5 to about 10 minutes causes solvent evaporation and provides highly adherent, non-tacky, hard, continuous and uniform films which are resistant to ordinary processing solvents.

Several types of volatile non-reactive solvents can be used to form layers per the present invention to reduce the solids content and permit the coating of very thin layers on the conductive surface. Classes of suitable solvents include, but are not limited to, aromatic solvents, such as toluene and xylene; ketones, such as methylethylketone and isophorone; acetates, such as ethyl acetate and butyl acetate; alcoholic solvents such as ethanol, isopropanol, butanol and tetrahydrofuran, etc. Mixtures of various solvents may also be used such as butyl acetate-isopropanol, methyl-ethyl-ketone-tetrahydrofuran, toluene-isopropanol-ethyl lactate, etc. The preferred solvents are tetrahydrofuran-isopropanol, toluene-butyl acetate-butanol or isopropanol alone. The solvent for the abrasion resistant topcoat is not critical so long as it does not cause gelation upon addition of organotitanium reagents prior to coating application. While not to be construed as limitative, we have found that an amount of solvent sufficient to provide a viscosity on the order of about 500 to about 600 cps (Brookfield Viscometer) is quite acceptable.

The cellulose derivatives such as cellulose acetate butyrate (CAB), ethyl cellulose, nitrocellulose and cellulose acetate preferably used are available from Eastman Chemicals. These materials have a hydroxy equivalent weight of about 300 to about 400. Several grades with varying hydroxyl contents from 0.33 to 1.0 hydroxyl groups per anhydroglucose unit can be employed.

Most preferred materials include ethyl cellulose, and nitrocellulose with about 0.75 hydroxyl groups per anhydroglucose unit.

The thickness of the protective layer is not limited in any special fashion so long as it is sufficiently thick to provide a uniform coverage of the conductive film, provides protection against abrasion and will not flake off during handling and the electroerosion printing process. Also, it should not substantially reduce print quality or printed spot resolution capability. Typically, however, relatively low thicknesses on the order of about 0.05 μm to about 0.6 μm are used to avoid the possibility of undesired accumulation of organic debris on the print head during electroerosion printing.

The titanium reagent modified film is typically formed by adding the organotitanium reagent, e.g., titanium acetylacetonate, to a preformed dispersion of solid lubricant in the desired hydroxyl group-containing polymer in a suitable solvent and after thorough mixing and, if necessary, dilution, the film is cast by any conventional technique onto the conductive surface of the composite structure, whereafter the same is subjected to a dry/cure cycle, typically at a temperature of about 100° to about 110° C. for about 5 to about 15 minutes when a plastic support such as Mylar ® is employed.

The atmosphere of the dry/cure cycle is not important and is typically air. The pressure is typically ambient.

During the dry/cure cycle, as the solvent evaporates, hydroxyl groups in the hydroxyl group containing organic polymer will undergo ligand exchange with the organic titanium reagent and result in a crosslinked/modified polymer matrix as set forth below in a simplified structure:

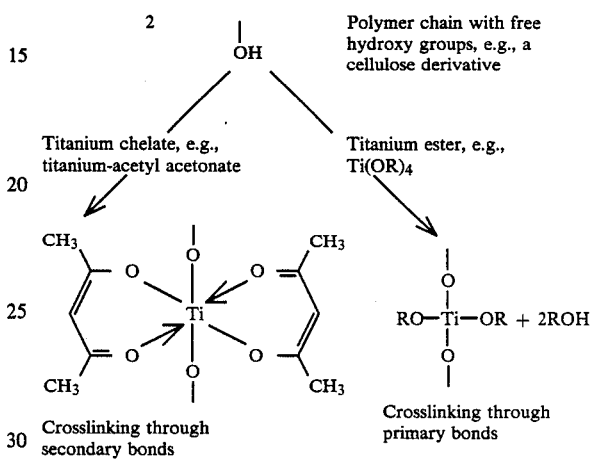

As earlier indicated, the abrasion resistant overcoat layer of the present invention most desirably contains one or more conductive or resistive solid particulate lubricants such as graphite. The general class of laminar solids may be employed as such lubricants. Examples include $MoS_2$, $WS_2$, $TaS_2$ and $CaF_2$ with graphite being preferred. Other compounds may be considered such as ZnO, $TiO_2$, AgI, PbO, $Pb(OH)_2$, $PbCO_3$, PbO, etc., since they have all been shown to be lubricants. In addition, soft metal particles such as Sn, Cu, Zn, Ag, Pb, Au, Bi and Al are expected to be useful in the present invention. According to the present invention, colloidal graphite suspensions in cellulosic binders in the presence of organotitanium crosslinking agents are preferred from the viewpoint of lubricity, abrasion resistance, dispersion quality and film uniformity.

The lubricating agent most preferably has a particle size equal to or less than 1 μm and when the same is graphite, it most preferably has a size of from about 200 angstroms to 1 micron, more preferably 200 angstroms to 500 angstroms.

Suitable graphite compositions that have been found to be useful are available commercially as ELECTRO-DAG 154 from Acheson Colloid Co. or similar products from Graphite Products Corp. or Superior Graphite Corp. ELECTRO-DAG 154 comprises graphite dispersed in a cellulose derivative such as ethyl cellulose and isopropanol as a solvent. It comprises about 20 weight percent solid (20 weight percent of which is binder and 80 weight percent of which is graphite), balance solvent. The most preferred protective lubricant coating formulations of the present invention are formed by thoroughly mixing the titanium reagents into such graphite dispersions followed by appropriate dilution with a suitable solvent(s) so as to adjust the viscosity or the desired dry thickness of the coating.

It has been found that with the titanium reagent modified abrasion resistant surface coatings that a range of binder and lubricant concentrations can be effectively used, e.g., from about 20 percent binder to about 80 percent lubricant to from about 40 percent binder to about 60 percent lubricant, the preferred lubricant being graphite.

The total organic binder content including the dispersion vehicle and the organic titanium reagent should preferably be maintained at a relatively low level for reasons of possible fouling concern due to organic debris generated during the electroerosion printing process which may adhere to the print head and interfere with the electroerosion printing process.

Since graphite is the preferred lubricant, hereafter the present expression will often be in terms of graphite as the lubricant. The present invention is not so limited, however.

Some available graphite/binder colloidal suspensions are provided in isopropanol as a solvent, while others incorporate trichloroethane and many other solvents are no doubt useful in the present invention. In addition, concentrated colloidal suspensions of graphite and water available commercially can also be employed in the present invention.

Following formation as above described, the resulting electroerosion recording material is subjected to electroerosion printing in a conventional manner, whereupon application of an electrical pulse to a stylus results in an arc or spark between the stylus and the conductive layer causing local removal of, e.g., aluminum which is selectively eroded along with the abrasion resistant top coat layer to expose the support or base layer when used. An offset or direct master per the present invention can be used in a conventional manner for offset lithographic printing with conventional oleophilic inks. In a similar fashion, it is used as direct negative in a conventional manner.

A special advantage of the approach of the present invention as compared to the use of an urethane crosslinked matrix formed using polyfunctional isocyanates as crosslinking agents for polymeric systems with free hydroxyl groups and other approaches in the prior art is that the organotitanium reagents are relatively less toxic, require no catalyst or initiator and effective modification of film properties can be achieved by adding as little as about 1 to about 5 percent of the organotitanium reagent with respect to the organic binder in coating formulations prior to application.

A brief thermal curing cycle at temperatures as low as about 50° to 100° C. suffices to form uniform, nontacky and abrasion resistant films.

Another merit of the use of abrasion resistant topcoat compositions according to the present invention is that coherent, uniform thin films can be obtained at very low organic binder contents relative to graphite or alternative solid lubricants. A low binder content in the overlayer is advantageous since in this case the debris generated during electroerosion printing or writing is relatively non-adherent and does not cake around the styli which would otherwise interfere with the printing process.

Having thus generally described the invention, the following specific examples will serve to illustrate the best mode of carrying out the invention and the fabrication of abrasion resistant electroerosion recording materials.

EXAMPLE 1

Base Coat Application

| Constituent | Parts By Weight |
| --- | --- |
| Cellulose acetate butyrate (CAB)* | 6.5 |
| Tetrahydrofuran (THF) | 20.0 |
| Toluene | 5.5 |
| Silica (IMSIL A108H) | 5.6 |
| Multron R221-75 (dispersant) | 0.3 |

*Unless otherwise indicated, the CAB was CAB553.4 available from Eastman Kodak; viscosity: 405 cp as a 15 weight percent solution in isopropanol (Brookfield Viscometer).

The CAB solution in THF and toluene was first prepared, and it was combined with the silica along with the dispersant and ball milled for 12-16 hours to form a homogeneous MILL BASE. The final coating composition was obtained by mixing the various ingredients described below in the following proportions:

|  | Parts By Weight |
| --- | --- |
| MILL BASE | 10 |
| CAB | 2.0 |
| THF | 6.5 |
| Toluene | 1.5 |
| Polyisocyanate (CB-75); crosslinker | 4.5 |
| In THF | 5.5 |
| Toluene | 1.5 |
| Surfactant (FC430) | 0.01 |
| Catalyst (T9) | 0.01 |

This composition was coated by web coating onto a 2 mil thick polyester substrate to a dry coating thickness of 200 microinches after drying/curing at 100°-110° C. for 5-10 minutes.

Deposition of Electroconductive Layer

Over the base layer described above was formed a layer of aluminum at a thickness of about 350 Angstroms deposited by a conventional technique of sputter evaporation or vacuum evaporation.

Overcoat Application

The following composition was used to form an abrasion resistant coating on the aluminum surface of the composite structure described above. All parts are by weight unless otherwise indicated.

| ELECTRODAG 154 | 1 part |
| --- | --- |
| Isopropanol (IPA) | 4 |
| Titanium acetylacetonate | 0.01 |

The titanium acetylacetonate was used in the form of a 75 weight percent solution in IPA. It was commercially available under the trade name TYZOR AA, available from E. I. du Pont de Nemours & Co., Inc.

After thorough mixing, the above composition was applied by conventional web coating to the electroconductive aluminum layer and dried at 100°-110° C. for 10-15 minutes. The final dry thickness of the coating was from 500-4,000 angstroms, typically 700 angstroms.

An overcoat composition with a slightly higher organic binder content can be formed by adding 1 part of a 4 weight percent solution of CAB to the above composition and the same can be applied to the electroconductive aluminum layer to obtain a continuous, uniform and abrasion resistant layer.

EXAMPLE 2

An aluminized structure having a 400 Angstrom thick aluminum layer with a hard intermediate layer interposed between the polyester support and the aluminum layer was prepared as described in EXAMPLE 1.

An overlayer was then deposited from the following composition to form an abrasion-resistant protective coating with lubricating properties. All parts are by weight.

| ELECTRO-DAG 154 | 1.0 |
|---|---|
| IPA | 4.0 |
| 4% CAB solution | 0.5 |
| Tetraisopropyl titanate | 0.06 |

The tetraisopropyl titanate is available from E. I. du Pont de Nemours & Co., Inc. under the trade name TYZOR® TPT.

The commercially available graphite dispersion, the IPA and the CAB solution (1:1 volume mixture of THF and IPA) were combined and ball milled for six hours. The tetraisopropyl titanate was then dissolved in 0.5 part of isopropanol and slowly added to the graphite-binder dispersion with constant stirring, and applied to the electroconductive aluminum surface using a conventional web coating technique with a continuous drying/curing cycle for 10-15 minutes at 95°-110° C. The thickness was per EXAMPLE 1.

EXAMPLE 3

An alternate underlayer comprising a silica-titanium chelate crosslinked ethyl cellulose matrix was formed on a polyester support as was used in EXAMPLE 1 from the following composition. All parts are by weight.

| Ethyl cellulose (N-22)* | 10.0 |
|---|---|
| Toluene | 55.0 |
| IPA | 30.0 |
| Ethyl lactate | 5.0 |
| Silica (IMSIL 108H) | 3.1 |
| Titanium acetyl-acetonate (TYZOR AA; 80% titanium compound, 20% IPA, by weight) | 2.0 |

*Available from Hercules Chemical Co.; ethoxy groups per anhydroglucose unit = 2.25; hydroxyl groups per anhydroglucose unit = 0.75; viscosity = 42 cp as a 5 weight percent solution in an 80:20 by volume toluene:ethanol mixture.

The ethyl cellulose was first dissolved in the solvent mixture, combined with the silica powder and then ball milled for 16 hours to form the desired mill base. Prior to coacing, to the mill base there was added a solution of two parts of TYZOR AA in 10.0 parts of IPA. After thorough mixing, the formulation was applied to the two mil thick polyester substrate on a continuous film casting apparatus with a controlled drying/curing cycle set at 100°-110° C. for 10-15 minutes to obtain a dry coating thickness for the resulting base layer between 200-250 microinches.

Subsequent aluminum film deposition was according to EXAMPLE 1.

The lubricant protective layer was formed on the aluminum surface from the following composition where all parts are by weight.

| ELECTRO-DAG 154 | 1.0 |
|---|---|
| 10% CAB solution | 0.4 |
| IPA | 2.0 |
| Toluene | 2.0 |
| Titanium Acetylacetonate (TYZOR AA) | 0.01 |

The CAB solution was prepared using an IPA-toluene mixture and combined with the colloidal graphite suspension, whereafter one part each of IPA and toluene were added. The mixture was then ball milled for sixteen hours. Prior to coating application, the dispersion was combined with the remainder of the solvents and the TYZOR AA, applied to the aluminum surface and dried/cured as described in EXAMPLE 2. The thickness was as per EXAMPLE 2.

EXAMPLE 4

Using the aluminized structure of EXAMPLE 1, an overlayer of the following constituents was formed on the surface of the aluminum. All parts are by weight.

| Cresol-formadehyde resin (novalak) | 20.0 |
|---|---|
| THF-Toluene-ethanol mixture (25:25:30 by vol) | 80.0 |
| Carbon black | 20.0 |
| Tetraisopropyl titanate (TYZOR TPT) | 5.0 |

The solution of the novalak resin in the solvent mixture was combined with the carbon black and the mixture was ball milled for 16 hours. Prior to coating application the resin-carbon black dispersion was diluted with 300 parts of a 1:1:1 volume mixture of THF-toluene-ethanol and combined with 5.0 parts of the tetraisopropyl titanate (TYZOR TPT) and applied and dried/cured as in EXAMPLE 1. The thickness was as in EXAMPLE 1.

While this invention has been described in connection with specific embodiments, it will be understood that those of skill in the art may be able to develop variations of the disclosed embodiments without departing from the spirit of the invention or the scope of the following claims.

Having thus described our invention, what we claim as new, and desire to secure by Letters Patent is:

1. An electroerosion recording material comprising:
   a non-conductive support,
   an electroerodible conductive layer; and
   an abrasion resistant overlayer which comprises a crosslinked polymer matrix formed by interaction of a hydroxyl group-containing polymer with one or more organo-titanium reagents wherein said overlayer is dried and cured to a final dry thickness of about 0.05 μm to about 0.6 μm.

2. The electroerosion recording material of claim 1 which further comprises a thin, hard polymeric layer between said non-conductive support and said electroerodible conductive layer.

3. The electroerosion recording material of claim 1 wherein said abrasion-resistant overlayer further comprises a conductive or resistive solid particulate lubricant.

4. The electroerosion recording material of claim 2 wherein said thin, hard polymeric layer further comprises a solid particulate filler.

5. The electroerosion recording material of claim 2 wherein the hard polymeric layer comprises a particulate material dispersed in a crosslinked polymer matrix.

6. The electroerosion recording material of claim 1 wherein the overlayer comprises graphite and a cellulose binder which has been crosslinked by said organotitanium reagents.

7. The electroerosion recording material of claim 3 wherein the lubricant in the overlayer is selected from the group consisting of graphite, carbon black, $MoS_2$ and conductive ZnO, and the cross-linked polymer matrix comprises the reaction product of one or more members selected from the group consisting of cellulose acetate butyrate, ethyl cellulose, nitrocellulose or cellulose acetate with one or more members selected from the group consisting of titanium esters and titanium chelates.

8. The electroerosion recording material of claim 1 wherein the organotitanium reagent is selected from the group consisting of tetraalkyltitanates of the formula $Ti(OR)_4$ wherein R is a hydrocarbon radical having from three to 12 carbon atoms.

9. The electroerosion recording material of claim 1 wherein said organotitanium reagent is a titanium ester selected from the group consisting of tetraisopropyl titanate, tetra-n-butyl titanate, tetrakis(2-ethylhexyl)-titanate and tetraethylene glycol titanate.

10. The electroerosion recording material of claim 1 wherein the organotitanium reagent is a titanium chelate selected from the group of titanium acetylacetonate, titanium triethanolamine chelate and titanium lactic acid chelate.

11. The electroerosion recording material of claim 1 wherein the overlayer is formed by blending about 5 to about 20 percent by weight of the organotitanium reagent with a performed graphite-binder-solvent dispersion based on the weight of the binder component.

12. The electroerosion recording material of claim 1 wherein the overlayer is formed of a composition comprising from about 20 to about 40 percent by weight polymeric binder, from about 60 to about 80 percent by weight lubricant, based on the weight of the binder plus lubricant, and from about 5 to about 20 percent by weight of said organotitanium reagent, based on the weight of the binder.

13. The electroerosion recording material of claim 1 wherein the hard layer between the non-conductive support and the electroerodible conductive layer is formed from a composition which comprises silica and a cellulose derivative which has been modified by subjecting the same to a dry/cure cycle at about 100°–110° C. for about 10 to 15 minutes in the presence of an organotitanium reagent to provide a final dry thickness therefor of between about 2 to about 10 μm.

* * * * *